United States Patent
Sidiropoulos et al.

(10) Patent No.: US 9,350,580 B2
(45) Date of Patent: May 24, 2016

(54) RECEIVER ARRANGEMENT AND A METHOD THEREIN

(71) Applicant: TELEFONAKTIEBOLAGET L M ERICSSON (PUBL), Stockholm (SE)

(72) Inventors: Georgios Sidiropoulos, Partille (SE); Karl-Erik Assarsson, Rydholm (SE); Vimar Björk, Göteborg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/430,758

(22) PCT Filed: Sep. 25, 2013

(86) PCT No.: PCT/EP2013/069992
§ 371 (c)(1),
(2) Date: Mar. 24, 2015

(87) PCT Pub. No.: WO2014/049005
PCT Pub. Date: Apr. 3, 2014

(65) Prior Publication Data
US 2015/0256372 A1 Sep. 10, 2015

(51) Int. Cl.
  *H04L 27/06* (2006.01)
  *H04L 27/14* (2006.01)
  *H04B 1/00* (2006.01)
  *H03G 3/30* (2006.01)
  *H04B 1/16* (2006.01)

(52) U.S. Cl.
  CPC .............. *H04L 27/14* (2013.01); *H03G 3/3078* (2013.01); *H04B 1/0003* (2013.01); *H04B 1/0057* (2013.01); *H04B 1/0082* (2013.01); *H04B 1/16* (2013.01)

(58) Field of Classification Search
  CPC .. H04L 25/067; H04L 1/0045; H03G 3/3052; H03G 3/3068; H04B 7/0808
  USPC ......... 375/340, 345; 327/339; 455/136, 197.3
  See application file for complete search history.

(56) References Cited

U.S. PATENT DOCUMENTS

| | | | |
|---|---|---|---|
| 6,833,758 B2 * | 12/2004 | Matsuyoshi | H03F 1/3247 330/149 |
| 7,366,236 B1 | 4/2008 | Terao | |
| 7,856,216 B2 | 12/2010 | Ichihara | |
| 2006/0025090 A1 * | 2/2006 | Shirakata | H04B 7/0808 455/136 |
| 2015/0147992 A1 * | 5/2015 | Khoini-Poorfard | H04B 1/30 455/197.3 |

FOREIGN PATENT DOCUMENTS

| | | |
|---|---|---|
| CN | 1543086 A | 11/2004 |
| CN | 101133567 A | 2/2008 |
| EP | 2296285 A1 | 3/2011 |

OTHER PUBLICATIONS

First Office Action issued on Dec. 25, 2015 in corresponding Chinese application No. 201380049933.3, 8 pages.

* cited by examiner

*Primary Examiner* — Khai Tran
(74) *Attorney, Agent, or Firm* — Rothwell, Figg, Ernst & Manbeck, P.C.

(57) ABSTRACT

An aspect of the solution herein is directed to a receiver arrangement (100) including multiple RF-filters (RF1, RF2, RF3) and RF-attenuators (RF-A1, RF-A2, RF-A3), one for each of multiple frequency bands (RX1, RX2, RX3), where each RF-attenuator (RF-A1, RF-A2, RF-A3) is provided with a respective power splitter (PS1, PS2, PS3) that connects the RF-attenuator to an average power detector (Pave), which is configured to monitor an average power of each frequency band, where all frequency bands share a common antenna arrangement (110), at least one common LNA (112, 112*a*, 112*b*) and a common mixer arrangement (114) configured to mix all frequency bands into a common analog signal, and where a peak power monitor arrangement (201) is configured to monitor the peak power of the common analog signal, wherein, the receiver arrangement includes a digitizer arrangement (200) configured to control the gain of each RF-attenuator based on the monitored average power of each band from the average power detector and a detected peak power of the common analog signal from the peak power monitor arrangement.

10 Claims, 6 Drawing Sheets

RECEIVER ARRANGEMENT AND A METHOD THEREIN

CROSS REFERENCE TO RELATED APPLICATION(S)

This application is a 35 U.S.C. §371 National Phase Entry Application from PCT/EP2013/069992 filed Sep. 25, 2013, which claims priority to U.S. Provisional Application No. 61/705,433, filed Sep. 25, 2012. The above identified

TECHNICAL FIELD

The present invention relates to wireless communication systems, in particular to receivers for large bandwidths and multiple bands and carriers.

BACKGROUND

In present day wireless communication systems, there is a constant and ever expanding need for large bandwidth capabilities.

In a receiver arrangement, it is possible to dedicate exactly one receiver line-up for each received band. In a system where bandwidth is not a major issue, this solution is prevalent. In order to increase the bandwidth, it is possible to duplicate the receiver and in this way increase the bandwidth in a linear way, i.e. one extra portion of bandwidth per added receiver.

This is the straightforward way, but also a costly way to implement a multi band receiver. Today, receivers for base stations have one dedicated chain of components for each received band. The antenna mast gets crowded with heavy equipment, in the same time it is difficult and expensive to find alternative sites for base station equipment.

The limited board space and power consumption ($P_{DC}$) put a limit on how many receivers that can be fitted on a printed circuit board (PCB). Also the total cost of the receiver will increase in a linear fashion for each added band using traditional receiver architecture, i.e. one dedicated receiver for each band.

Consequently, there is a need for methods and arrangements in receivers enabling supporting larger bandwidth requirements, without necessitating increasing board space and power consumption in the receivers.

SUMMARY

The present invention relates to an improved receiver arrangement.

In a first aspect, an embodiment of a receiver arrangement includes multiple RF-filters and RF-attenuators, one for each of multiple frequency bands. Further, each RF-attenuator is provided with a respective power splitter that connects the RF-attenuator to an average power detector, which is configured to monitor an average power of each frequency band. All frequency bands share a common antenna arrangement, at least one common LNA and a common mixer arrangement configured to mix all frequency bands into a common analog signal. Further, the receiver arrangement includes a digitizer arrangement configured to control the gain of each RF-attenuator based on the monitored average power of each band and a detected peak power of the analog signal.

In a second aspect, an embodiment of a digitizer arrangement in a receiver arrangement includes a peak monitor that is configured to monitor the power of an analog signal, which is typically performed in the digital domain. Further, the digitizer includes a mean power monitor arrangement that is configured to detect and monitor a mean power for a plurality of frequency bands. In practice, the mean power monitor is configured to receive a detected mean power for each respective frequency band. Further, the digitizer arrangement includes a max mean power detector unit, which is configured to compare the mean power from each frequency band and detect which is the largest. In other words, the detector unit is configured to detect a maximum average power from all frequency bands. Additionally, the digitizer arrangement includes an automatic gain control (AGC) unit, which is configured to control the respective gain of the respective frequency bands based on a detected peak power and a detected maximum average power.

In a third aspect, a method in a digitizer arrangement includes receiving an analog signal, and monitoring and detecting a peak power of the received signal. Subsequently, or simultaneously, detecting a respective average power of a plurality of frequency bands, and detecting the maximum average power. Thereby the frequency band that has the highest average power is identified. Subsequently, the gain of the identified frequency band is controlled based on at least the peak power and the maximum average power.

Advantages include providing multi band receiving capability which is space saving compared to prior art.

BRIEF DESCRIPTION OF THE DRAWINGS

The technology of the present disclosure, together with further objects and advantages thereof, may best be understood by referring to the following description taken together with the accompanying drawings, in which.

ABBREVIATIONS

A/D or ADC Analog to Digital Converter
AGC Automatic Gain Control
Anti-alias filter Attenuates energy at frequencies that are folded in the ADC.
BB Baseband (signal without its high-frequency carrier)
DPX Duplex filter (only receive path is shown here)
FS Full scale (often used together with ADC's)
IF Intermediate Frequency
LNA Low Noise Amplifier
Mixer An electronic device which changes the frequency of the
RF-signal
RF Radio Frequency
RF-ATT RF attenuator
RF-band a contiguous frequency band where the target signal has its energy
RF-filter Radio Frequency filter
RX Receiver block
TX Transmitter block
Transceiver Transmitter and Receiver block
VCO Voltage Controlled Oscillator

DETAILED DESCRIPTION

The present disclosure relates to receivers in general and in particular to wideband receivers capable of digitizing multiple frequency bands simultaneously. The embodiments will be described in the context of a 3GPP capable system, but also other similar systems can equally benefit from the present disclosure. Although the present disclosure describes a receiver, it is evident that it can be implemented together with a transmitter in a transceiver circuitry.

The inventors have identified the need for implementing a multi band receiver, which is cost-efficient as well as enables reducing the need for crowding antenna masts with heavy equipment.

Consequently, the inventors have developed a receiver arrangement e.g. base station receiver, which is capable of digitizing all received frequency bands simultaneously. This is achieved by enabling the different signal paths e.g. frequency bands, to share some resources whilst maintaining separation on other resources. In particular, each frequency band is supported by a separate radio frequency filter (RF-filter) and RF attenuator (RF-ATT) arrangement. Further, a novel digitizer and controller arrangement 200 is provided in order to control each frequency separately. Thereby the gain of each frequency band e.g. signal path, can be independently controlled based on both the peak power of the base station and on the average power of each frequency band.

Figure 1:
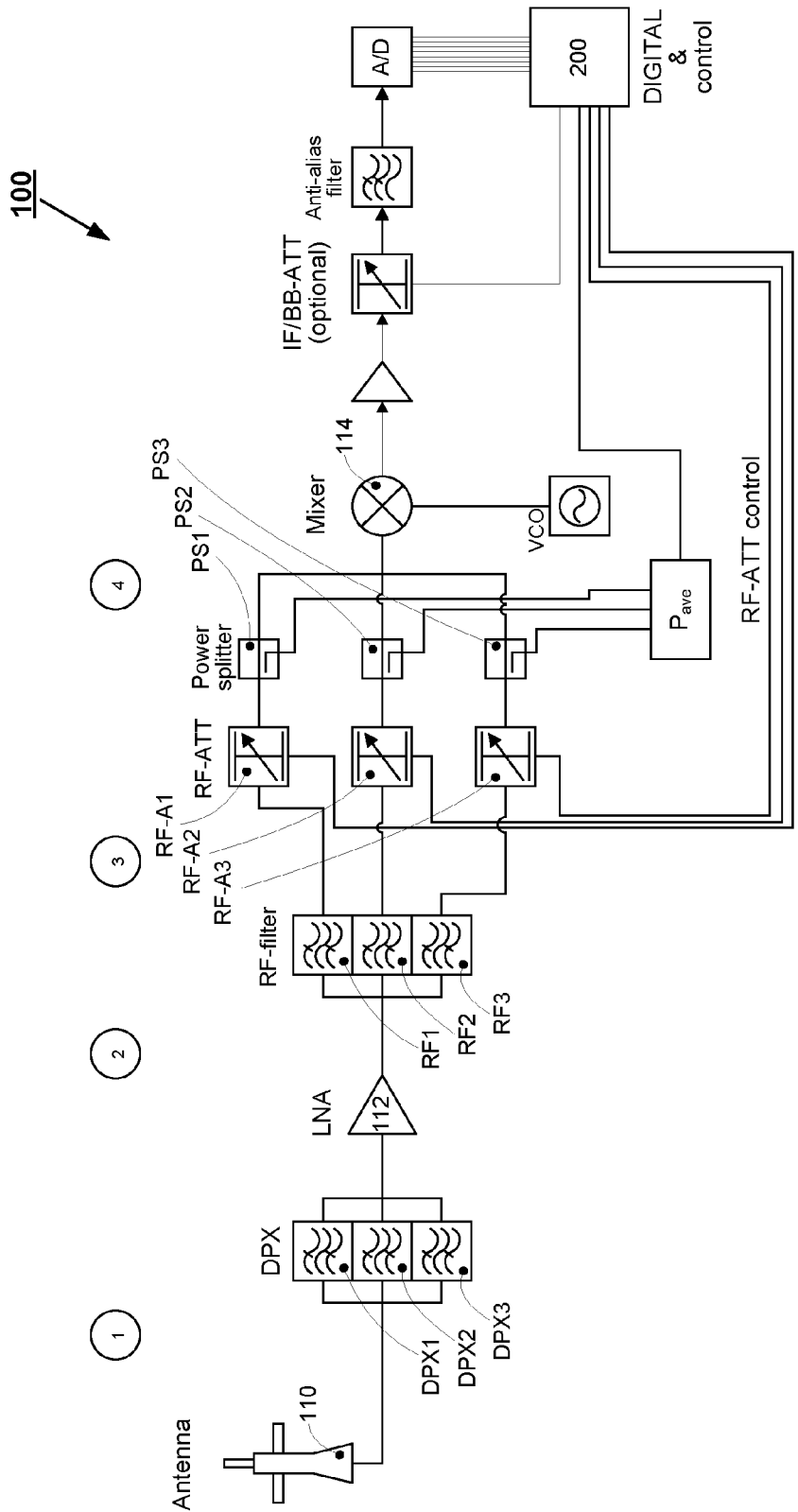
FIG. 1 is a schematic circuit diagram of an embodiment of a receiver arrangement according to the present technology.

With reference to FIG. 1, an embodiment of a receiver arrangement 100 according to the present disclosure will be described. Instead of implementing a separate receiver chain for each frequency band, in the current disclosure each frequency band receiver chain share an antenna 110, a low noise amplifier (LNA) 112 and a mixer 114, whilst each frequency band has a separate duplexer DPX1, DPX2, DPX3, a separate RF-filter RF1, RF2, RF3 and a separate RF-attenuator RF-A1, RF-A2, RF-A2 respectively. This is possible since the LNA 112 is not typically limited by current bandwidth requirements, and the same is true for the mixer 114. The attenuation of each band is controlled separately based on a novel digitizer and controller arrangement 200. In other words, the receiver arrangement 100 includes multiple RF-filters RF1, RF2, RF3 and RF-attenuators RF-A1, RF-A2, RF-A2, one for each of multiple frequency bands. Further, each RF-attenuator RF-A1, RF-A2, RF-A2 is provided with a respective power splitter PS1, PS2, PS3 respectively, which connects the RF-attenuator to an average power detector Pave, which is configured to monitor an average power of each frequency band. All frequency bands share a common antenna arrangement 110, at least one common LNA 112 and a common mixer arrangement 114 configured to mix all frequency bands into a common analog signal. Further, the receiver arrangement includes a digitizer arrangement 200 configured to control the gain of each RF-attenuator based on the monitored average power of each band and a detected peak power of the common analog signal.

In brief,
a) One receiver digitizing all bands simultaneously.
b) Each band will have a unique RF-ATT circuit controlling the gain associated with that signal path.
c) Both peak and average power detection is utilized in controlling the RF-ATT. Using average power detection from each received band it is possible to control the gain on the signal path for each band independently.

A typical base station receiver consists of the corresponding components depicted in FIG. 1. This disclosure uses the same basic elements, but the connection and control of the components is done in a different way.

An idea of this disclosure is to digitize several bands simultaneously. In order to reduce the dynamic range of received signal, one AGC unit or process for each band is used.

The present disclosure uses the broadband characteristics of the LNA and mixer, where the combined spectrum from all wanted bands is handled. The respective RF-ATT devices are controlled so that the ADC never goes beyond its full scale (FS) range. Signals below FS are accurately converted in the ADC. By controlling the amplification of the signal in each band separately, it is possible to use the dynamic range of the ADC to digitize several received bands in just one ADC.

Figure 2:
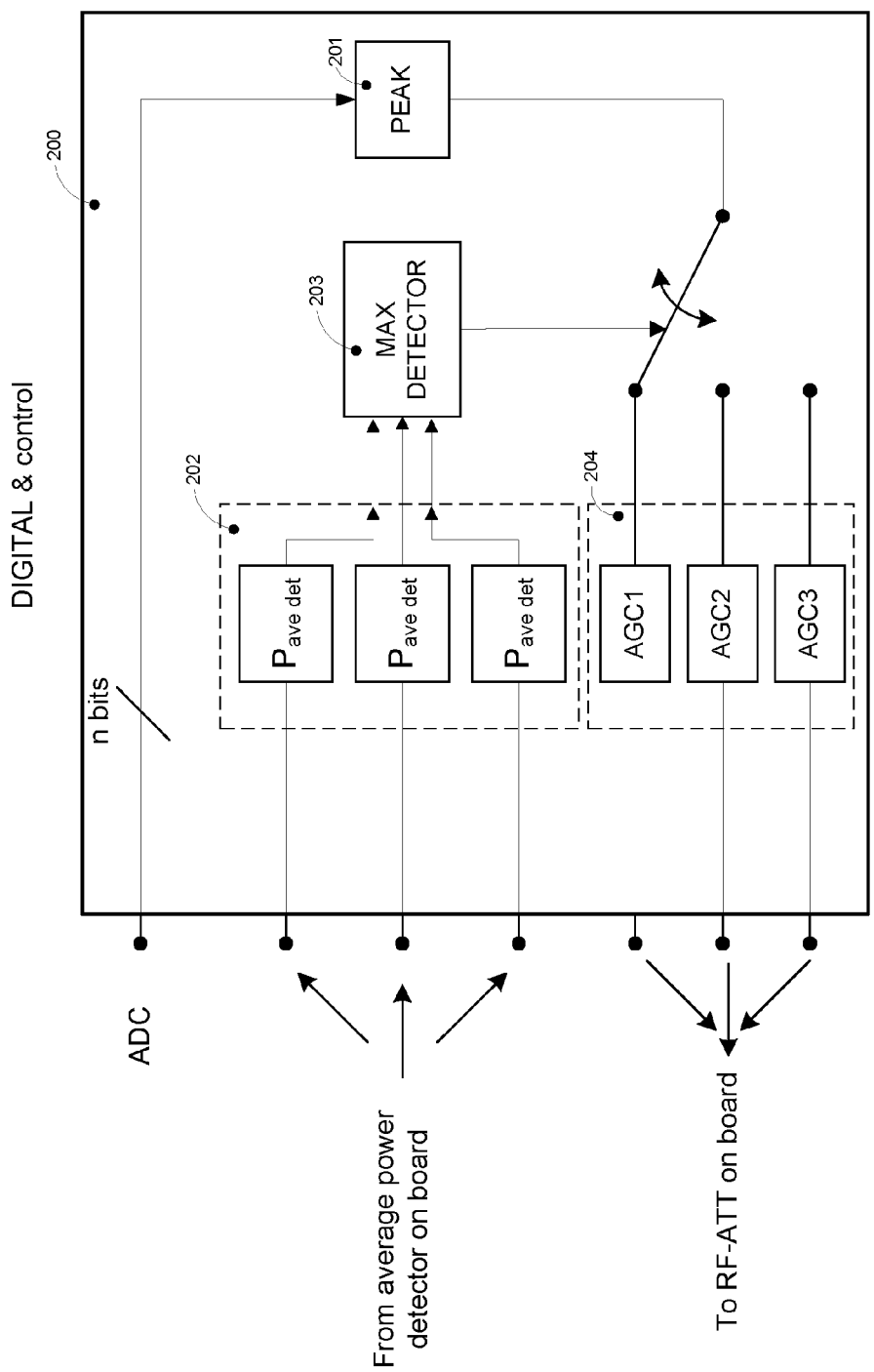
FIG. 2 is a schematic illustration of an embodiment of a digitizer arrangement according to the present technology.

With reference to FIG. 2, an embodiment of a digitizer arrangement 200 according to the present disclosure will be described.

The digitizer arrangement 200 includes a peak power monitor arrangement 201 that is configured to monitor the power of the common analog signal e.g. the peak power, which is typically performed in the digital domain. Further, the digitizer 200 includes a mean power monitor arrangement 202 that is configured to detect and monitor a mean power for a plurality of frequency bands. In practice, the mean power monitor is configured to receive a detected mean power for each respective frequency band. In FIG. 2 the mean power monitor arrangement 202 is depicted as three (e.g. three frequency bands) separate units, one for each frequency band. However, it is equally applicable to have a singe mean power monitor unit (as indicated by the dotter box) configured to detect and monitor the mean power from each frequency band. Further, the digitizer arrangement 200 includes a max mean power detector unit 203, which is configured to compare the mean power from each frequency band and detect which is the largest. In other words, the detector unit is configured to detect a maximum average power from all frequency bands. Additionally, the digitizer arrangement 200 includes an automatic gain control (AGC) unit 204, which is configured to control the respective gain of the respective frequency bands based on a detected peak power and a detected maximum average power. Although, the AGC is actually depicted as three (e.g. three frequency bands) separate units, one for each frequency band, it is equally applicable to have a single AGC unit (as indicated by the dotter box) configured to control the gain for each frequency band. It is further evident that the above-described units can be implemented as single units, or as combined units.

Although the above discussed AGC arrangements 204 of the digitizer unit 200 are illustrated as separate entities, they can equally well be implemented as a single AGC arrangement configured to control the gain of each frequency band e.g. RF-attenuator separately. In a corresponding manner, the illustrated separate average power detector arrangements and the maximum average power detector arrangement can be implemented as a single unit configured to monitor the average power of each frequency band and detect which frequency band has the largest average power.

Peak detection is preferably done in the digital domain and together with the information or a digital representation thereof from the average detectors, the decision to trigger the RF-ATT is done in the "DIGITAL & control"-block arrangement 200 in FIG. 1, see FIG. 2 for detailed view of this block 200.

The peak detector arrangement 201 monitors that the common analog signal does not hit an upper limit of the ADC input range, i.e. is not clipped by the ADC and the MAX detector determines which frequency band that has the highest power level, thus the signal path with the highest power level will have its RF-ATT triggered and the gain of that signal path will decrease accordingly. Although the present disclosure is described with reference to controlling e.g. reducing the gain based on a highest power level, it is equally applicable to any control of the gain. In other words, for some applications it might be beneficial to balance the gain between some or all of the different frequency bands. Further, it might be beneficial to actually increase the gain for some or all the frequency bands in cases where the analog power is below a certain predetermined level.

Due to the reduction of the gain, for at least one frequency band, caused by the control of the corresponding RF-ATT the signal level has decreased at the ADC, and there is no risk of clipping the peaks. If the signal continues to increase in power, it is possible to repeat this action with multiple states in the attenuator device. When the signal level decreases, the gain of that signal path can be restored to a higher gain setting.

According to a particular embodiment, the digitizer arrangement 200 may be included in a base station receiver.

Figure 3:
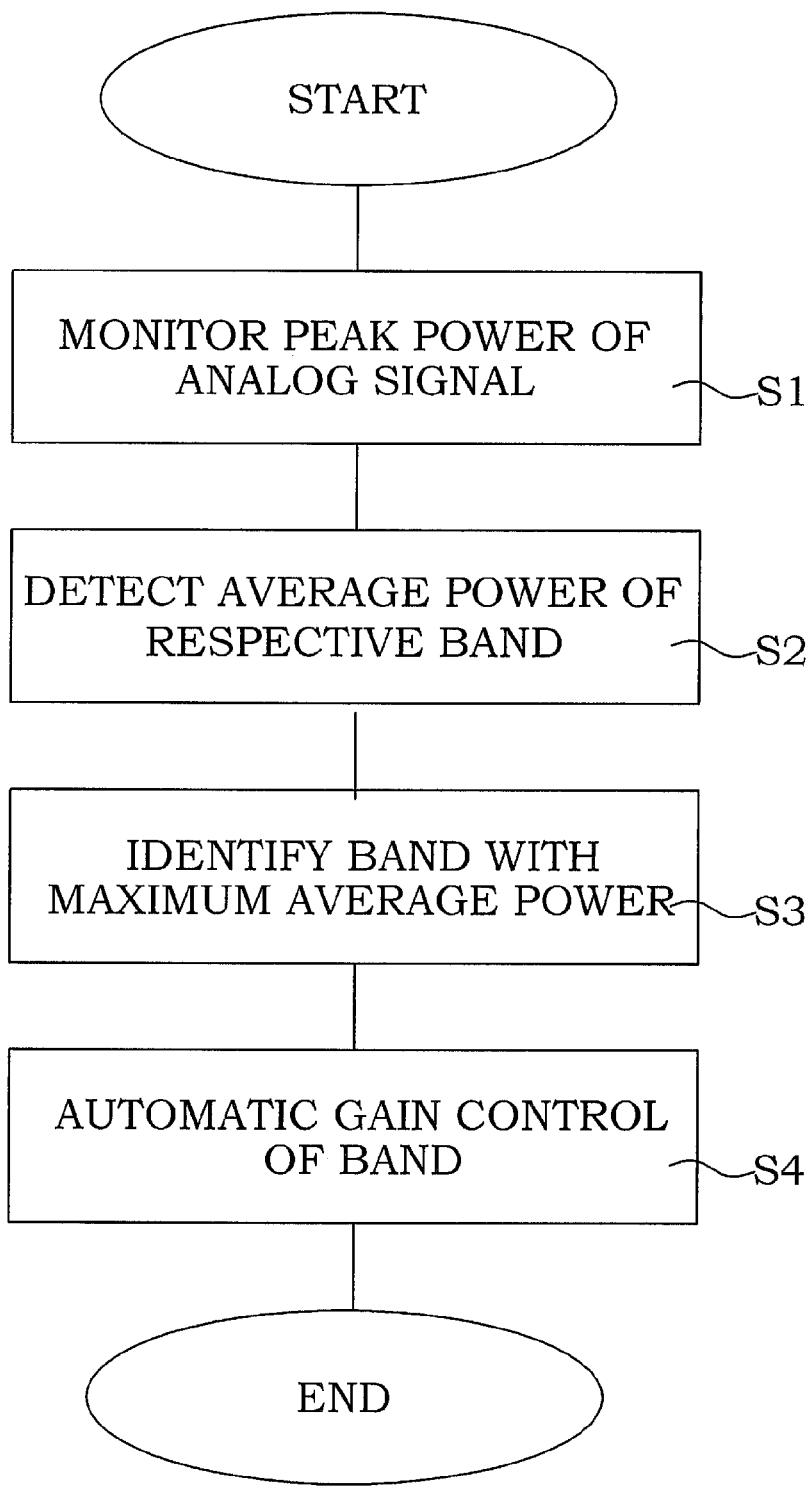
FIG. 3 is a schematic illustration of an embodiment of a method in a digitizer according to the present technology.

With reference to the flow chart in FIG. 3, an embodiment of a method in a digitizer arrangement will be described.

The common analog signal e.g. digitized version of the common analog signal received from an ADC, is received in the digitizer arrangement 200 and a peak power of the signal is monitored, preferably by the peak power monitor arrangement 201 in step S1. Subsequently, or simultaneously, a respective average power of a plurality of frequency bands is detected, preferably by the mean power monitor arrangement 202, in step S2, and the maximum average power is detected, preferably by the max mean power detector unit 203, in step S3. Thereby the frequency band that has the highest average power is identified. Subsequently, the gain of the identified frequency band is controlled, preferably by the automatic gain control (AGC) unit 204, in step S4 based on the peak power and the maximum average power.

The multiple states in the attenuator device can comprise a number of predetermined or preset attenuation steps. In other words, a first attenuation step could be followed by one or more attenuation steps until the peak power of the analog signal is reduced to or below a predetermined value. Correspondingly, the gain of the signal path can likewise be restored stepwise with varying size steps. According to further embodiments, the attenuation steps can be performed on one AGC at a time, or jointly for two or more AGC at the same time depending on the particular power situation. If a reduction of the gain for one frequency band does not have the expected impact on the peak power, it could potentially be beneficial to reduce the gain for all or a subset of the frequency bands. Possibly, it could be beneficial to balance the respective power of the frequency bands to a same mean power.

With reference to FIG. 1 and the diagrams in FIG. 4, various aspects of the present disclose will be described.

The example below will describe a typical scenario for a multi band receiver. Consider the case where three bands are down converted, RX1-RX3 denote the wanted bands respectively. The spectrum at the points indicated by numbers 1-4 in FIG. 1 is shown in FIG. 4.

Figure 4:
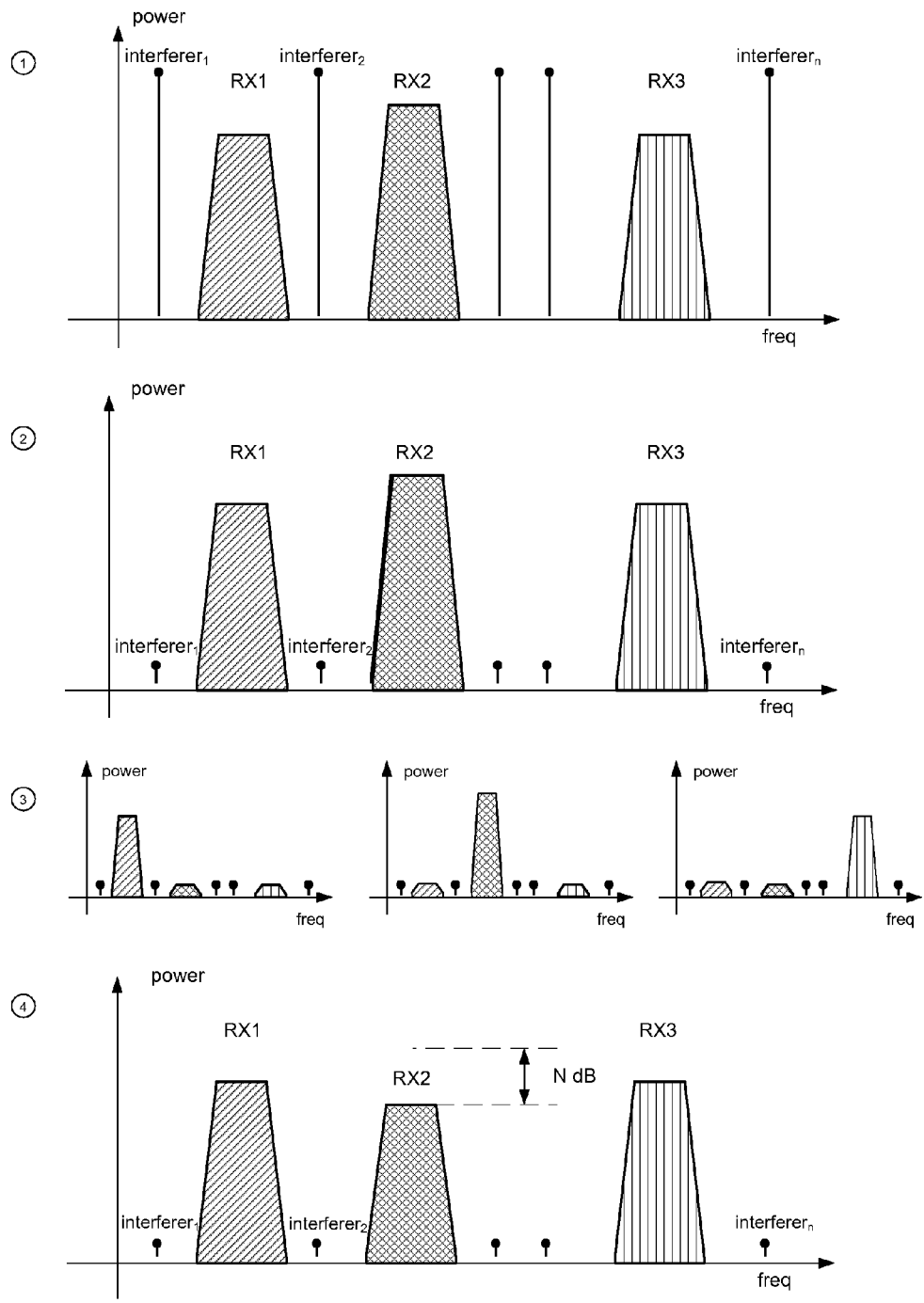
FIG. 4 is a schematic illustration of the frequency spectrum at different points in an embodiment of a receiver according to the present disclosure.

In FIG. 4, the frequency spectrum is shown through the signal path in the receiver.
1) Spectrum at antenna and DPX input. Three bands are considered; several narrowband interferers and three broadband wanted signals.
2) After DPX filter, the power from out-of-band interferers is attenuated.
3) Splitting the signal, one for each band. It is necessary to divide the combined spectrum so that the attenuator (RF-A1, RF-A2, RF-A3 respectively) can operate on one band each.
4) Combined spectrum at input of mixer 114. The effect of AGC on power in the spectrum. Here, band RX2 is assumed to have the highest power and is attenuated NdB in RF-ATT device controlling RX2.

If necessary, there is an option to have an attenuator device on the combined baseband signal, IF/BB-ATT in FIG. 1.

In FIG. 4, point 3, the remaining power from the other frequency bands in each frequency band diagram indicates that the RF-filter is not entirely successful in filtering the analog signal. However, the remaining power is small enough to be disregarded since the power of the frequency band in question is several times larger.

Figure 5:
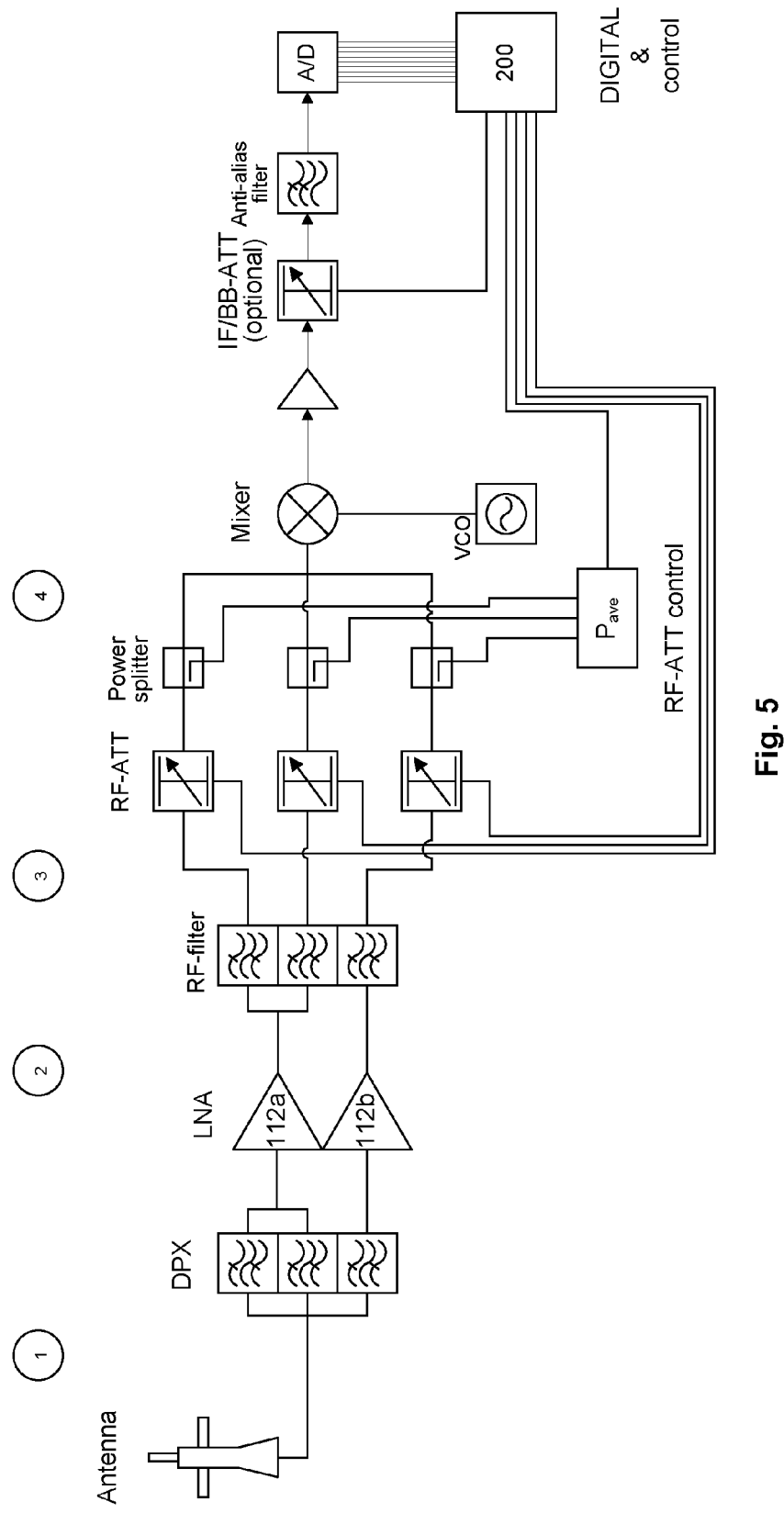
FIG. 5 is a schematic circuit drawing of another embodiment of a receiver according to the present disclosure.

With reference to FIG. 5, a further embodiment of a receiver arrangement 100 according to the present disclosure will be described.

For present day systems, the LNA is typically not a limiting factor thus making possible to share one LNA between multiple frequency bands. However, in the future the increasing bandwidth demands may cause the LNA to become the limiting factor. In that situation, it might be necessary to add an additional LNA to enable the entire bandwidth, thus separating the respective frequency bands into a high band, which is handled by one LNA 112a and a low band, that is handled by another LNA 112b. The remaining parts of the receiver arrangement are configured according to the previously described embodiments referring to FIG. 1.

If the requirement on dynamic range is strict, as for the case with receivers for base stations, then the LNA can be divided in two or more LNA's in parallel, see FIG. 5. In the case where two LNA's are used in parallel, a division in frequency of appropriate size can be made to form a low band and a high band. In this way, the harmonic generation from the one LNA cannot hurt any other band.

The frequency spectrum as shown in FIG. 4 applies here as well, with the addition that the bands are separated in a high and low configuration as described above.

Figure 6:
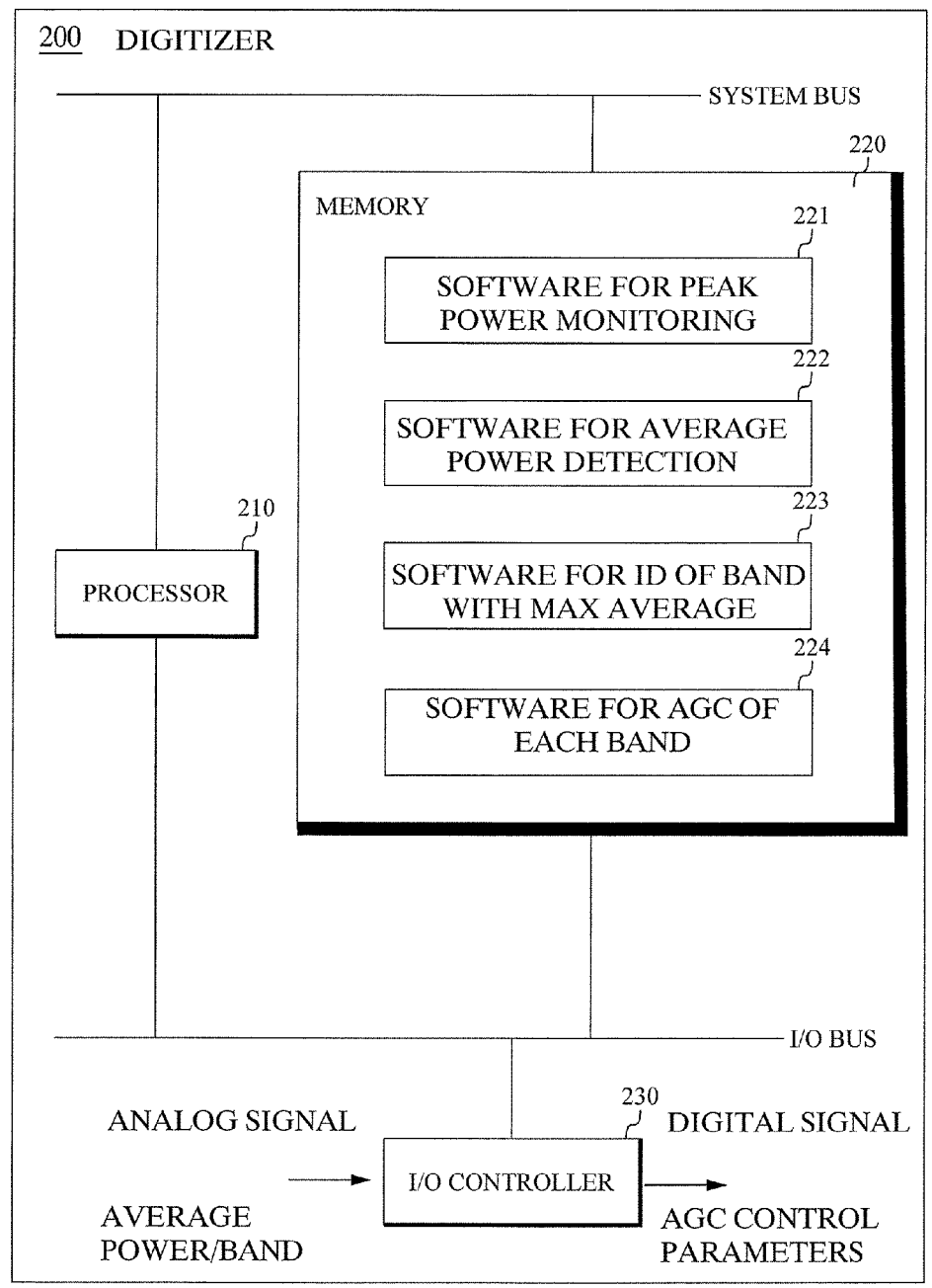
FIG. 6 is a schematic illustration of a computer implementation of the present disclosure.

In the following, a further example of an embodiment of a digitizer arrangement 200 in a receiver arrangement 100 will be described with reference to FIG. 6. This embodiment is based on a processor 210, for example a micro processor, which executes a software component 221 for monitoring the peak power of a received analog signal, a software component 222 for detecting and monitoring an average power of each frequency band of the analog signal, and a software component 223 for identifying a maximum average power of the frequency bands, and a software component 224 for controlling the gain of each frequency band of the analog signal. These software components are stored in memory 220. The processor 210 communicates with the memory over a system bus. The analog signal is received by an input/output (I/O) controller 230 controlling an I/O bus, to which the processor 210 and the memory 220 are connected. In this embodiment, the signal received by the I/O controller 230 is stored in the memory 220, where it is processed by the software components. Software component 221 may implement the functionality of the peak power detection and monitoring step S1 in the embodiment described with reference to FIG. 7 above. Software component 222 may implement the functionality of the average power detection and monitoring step S2 in the embodiment described with reference to FIG. 3 above. Software component 223 may implement the functionality of the maximum average power detection step S3 in the embodiment described with reference to FIG. 3 above. Software component 224 may implement the functionality of the automatic gain control step S4 in the embodiment described with reference to FIG. 3.

The I/O unit 230 may be interconnected to the processor 210 and/or the memory 220 via an I/O bus to enable input and/or output of relevant data such as input parameter(s) and/or resulting output parameter(s).

At least some of the steps, functions, procedures, and/or blocks described above may be implemented in software for execution by a suitable processing device, such as a microprocessor, Digital Signal Processor (DSP) and/or any suitable programmable logic device, such as a Field Programmable Gate Array (FPGA) device.

It should also be understood that it might be possible to re-use the general processing capabilities of the network nodes. For example this may, be performed by reprogramming of the existing software or by adding new software components.

The software may be realized as a computer program product, which is normally carried on a computer-readable medium. The software may thus be loaded into the operating memory of a computer for execution by the processor of the computer. The computer/processor does not have to be dedicated to only execute the above-described steps, functions, procedures, and/or blocks, but may also execute other software tasks.

The technology of the present disclosure reduces the number of signal paths for a multi-band receiver, allowing for lower power consumption, manufacturing cost, weight, and smaller size.

Components that have inherently high bandwidth are utilized in a much more efficient way if they can be shared between several bands in a receiver line-up. This invention makes it possible to add one or more received bands with only a small increase in cost, area, and power consumption.

The industry is moving towards more broadband solutions of receivers and the technology of the present disclosure addresses power consumption, board space and component count in a favorable way.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible.

The exemplifying embodiments described above may be summarized in the following manner:

One exemplifying embodiment is directed to receiver arrangement including multiple RF-filters and RF-attenuators, one for each of multiple frequency bands, each RF-attenuator is provided with a respective power splitter that connects the RF-attenuator to an average power detector, which is configured to monitor an average power of each frequency band. All frequency bands share a common antenna arrangement, at least one common LNA and a common mixer arrangement configured to mix all frequency bands into a common analog signal. Further, the receiver arrangement includes a peak power monitor arrangement configured to monitor the peak power of the common analog signal. In addition, the receiver arrangement includes a digitizer arrangement configured to control the gain of each RF-attenuator based on the monitored average power of each band from the average power detector and a detected peak power of the common analog signal from the peak power monitor arrangement.

Another exemplifying embodiment is directed to a digitizer arrangement, arranged to operate in a receiver arrangement. The digitizer arrangement includes a peak power monitor arrangement that is configured to monitor the peak power of an analog signal, and a average power detector that is configured to detect and monitor an average power for each of a plurality of frequency bands in the analog signal, and a max mean power detector unit, which is configured to compare the average power from each frequency band and detect which is the largest, and an automatic gain control, AGC, unit, which is configured to control the respective gain of the respective frequency bands based on a detected peak power and a detected largest average power.

Another exemplifying embodiment is directed to a method in a digitizer arrangement includes receiving an analog signal, and monitoring and detecting a peak power of the received signal, and detecting a respective average power of a plurality of frequency bands, and identifying the frequency band that has the highest average power, control the gain of the identified frequency band based on at least the peak power and the maximum average power.

The invention claimed is:

1. A receiver apparatus including multiple RF-filters and RF-attenuators, each said RF-attenuator having a gain that is adjustable, one for each of multiple frequency bands, each RF-attenuator is provided with a respective power splitter that connects the RF-attenuator to an average power detector, which is configured to monitor an average power of each frequency band, where all frequency bands share a common antenna apparatus, at least one common low noise amplifier (LNA) and a common mixer apparatus configured to mix all frequency bands into a common analog signal, and where a peak power monitor apparatus is configured to monitor the peak power of the common analog signal, wherein, the receiver apparatus includes: a digitizer apparatus configured to control the gain of each RF-attenuator based on the monitored average power of each band from the average power detector and a detected peak power of the common analog signal from the peak power monitor apparatus.

2. A digitizer apparatus, arranged to operate in a receiver apparatus, comprising:
   a peak power monitor apparatus configured to detect a peak power of an analog signal comprising a plurality of frequency bands including a first frequency band and a second frequency band that is separated from the first frequency band by a particular bandwidth;
   an average power detector configured to detect a first average power for the first frequency band in the analog signal and detect a second average power for the second frequency band in the analog signal;
   a max mean power detector unit configured to detect a largest average power by, at the least, comparing the first average power with the second average power to determine which is larger; and
   an automatic gain controller configured to adjust the power of one or more of the first and second frequency bands based said detected peak power of the common analog signal and said detected largest average power.

3. The digitizer apparatus of claim 2, further comprising a mixer for combining the plurality of frequency bands to produce the analog signal.

4. The digitizer apparatus of claim 2, further comprising:
   a first RF-attenuator, coupled to the gain controller, for modifying the power of the first frequency band; and
   a second RF-attenuator, coupled to the gain controller, for modifying the power of the second frequency band, wherein
   the gain controller is configured to adjust the power of the first frequency band by issuing a control signal to the first RF-attenuator, and the gain controller is further configured to adjust the power of second first frequency band by issuing a control signal to the second RF-attenuator.

5. The digitizer apparatus of claim 4, further comprising:
an antenna apparatus for receiving a transmitted signal;
a low noise amplifier (LNA) coupled to the antenna apparatus for amplifying the signal received by the antenna apparatus;
a first filter configured to receive and filter the signal amplified by the LNA to produce a first filtered signal;
a second filter configured to receive and filter the signal amplified by the LNA to produce a second filtered signal, wherein
the first RF-attenuator is configured to receive the first filtered signal and adjust the power of the first filtered signal based on a control signal from the gain controller, and
the second RF-attenuator is configured to receive the second filtered signal and adjust the power of the second filtered signal based on a control signal from the gain controller.

6. A method in a digitizer apparatus, the method comprising:
receiving an analog signal comprising a set of frequency bands including a first frequency band and a second frequency band that is separated from the first frequency band by a particular bandwidth;
detecting a peak power of the received analog signal;
detecting a first average power of the first frequency band;
detecting a second average power of the second frequency band that is separated from the first frequency band by a particular bandwidth;
identifying a frequency band included in said set of frequency bands that has the highest average power, wherein identifying the frequency band that has the highest average power comprises comparing the first average power with the second average power to determine which is larger; and
controlling the power of the identified frequency band based on at least the detected peak power.

7. The method of claim 6, wherein controlling the power of the identified frequency band based at least on the detected peak power comprises;
determining whether the detected peak power meets or exceeds a threshold; and
as a result of determining that the detected peak power meets or exceeds the threshold, reducing the power of the identified frequency band.

8. A method performed by a signal receiving apparatus, the method comprising:
receiving a transmitted signal;
employing an amplifier to amplify the received signal, thereby producing an amplified signal;
employing a first band pass filter to filter the amplified signal, thereby producing a first filtered signal;
employing a second band pass filter to filter the amplified signal, thereby producing a second filtered signal;
employing a mixer to mix a set of filtered signals to produce a common analog signal, said set of filtered signals comprising the first filtered signal and the second filtered signal;
detecting a peak power of the common analog signal;
detecting a first average power of the first filtered signal;
detecting a second average power of the second filtered signal;
using the detected first and second average powers, identifying a filtered signal included in said set of filtered signal that has the greatest detected average power; and
determining that the detected peak power meets or exceeds a power threshold; and
as a result of determining that the detected peak power meets or exceeds the power threshold, reducing the power of said identified filtered signal, thereby producing a reduced power filtered signal.

9. The method of claim 8, wherein
the identified filtered signal is the first filtered signal, and
the method further comprises: employing said mixer to mix, at the least, the reduced power filtered signal and the second filtered signal to produce a second common analog signal and employing a converter to digitize said second common analog signal.

10. The method of claim 8, wherein
the identified filtered signal is the first filtered signal, and
the method further comprises: reducing the power of the second filtered signal to produce a second reduced power filtered signal; employing said mixer to mix, at the least, the first reduced power filtered signal and the second reduced power filtered signal to produce a second common analog signal; and employing a converter to digitize said second common analog signal.

* * * * *